(12) United States Patent
Chong et al.

(10) Patent No.: US 10,763,267 B2
(45) Date of Patent: Sep. 1, 2020

(54) MEMORY STRUCTURE WITH MULTI-CELL POLY PITCH

(71) Applicant: Arm Limited, Cambridge (GB)

(72) Inventors: Yew Keong Chong, Austin, TX (US); Sriram Thyagarajan, Austin, TX (US); Munish Kumar, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/244,047

(22) Filed: Jan. 9, 2019

(65) Prior Publication Data

US 2020/0219890 A1    Jul. 9, 2020

(51) Int. Cl.
H01L 27/11 (2006.01)
H01L 27/02 (2006.01)
G11C 11/419 (2006.01)
H01L 23/528 (2006.01)
G11C 11/418 (2006.01)

(52) U.S. Cl.
CPC ........ *H01L 27/1104* (2013.01); *G11C 11/418* (2013.01); *G11C 11/419* (2013.01); *H01L 23/528* (2013.01); *H01L 27/0207* (2013.01)

(58) Field of Classification Search
CPC ............. H01L 27/1104; H01L 27/0207; H01L 23/528; G11C 11/419; G11C 11/418
See application file for complete search history.

(56) References Cited

U.S. PATENT DOCUMENTS

2015/0235674 A1* 8/2015 Chi ........................... G11C 5/04 365/49.1
2016/0306911 A1* 10/2016 Kuo .................... G06F 17/5072
2018/0294256 A1* 10/2018 Lee ..................... H01L 23/5286

* cited by examiner

*Primary Examiner* — Ajay Ojha
(74) *Attorney, Agent, or Firm* — Pramudji Law Group PLLC; Ari Pramudji

(57) ABSTRACT

Various implementations described herein refer to an integrated circuit having a memory structure with a two-bitcell layout and a four cell poly pitch. The two-bitcell layout includes a first bitcell and a second bitcell with structural contours that are joined together in a coupling arrangement. The first bitcell and the second bitcell have multiple transistors that are arranged to store data during write operations and allow access of data during read operations.

19 Claims, 4 Drawing Sheets

MEMORY STRUCTURE WITH MULTI-CELL POLY PITCH

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuitry, current 2-port bitcells used in industry are traditionally 2-CPP (cell poly pitch) that needs to fit both read and write wordlines (WLs) for 2-port bitcell in the 2-CPP pitch. As device geometries are scaled to smaller nodes, the metal resistances typically increase exponentially. The large metal resistance may result in large wordline (WL) resistance-capacitance (RC) and slows down the 2-port memory performance.

In reference to the negative impact on area, the 2-CPP bitcell layout may result in an aspect-ratio that is not favorable at the system-on-chip (SoC) for the memory-macro sizes that are typically used for 2-port memories (less words and more bits). At the SoC level, additional area may be lost around memory that cannot be used in SoC placement or routing.

In reference to the negative impact on performance/timing, the 2-CPP bitcell layout may result in a long wordline that causes a larger resistance and capacitance on the wordline-net, which degrades the performance/access-time of the memory-macro.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
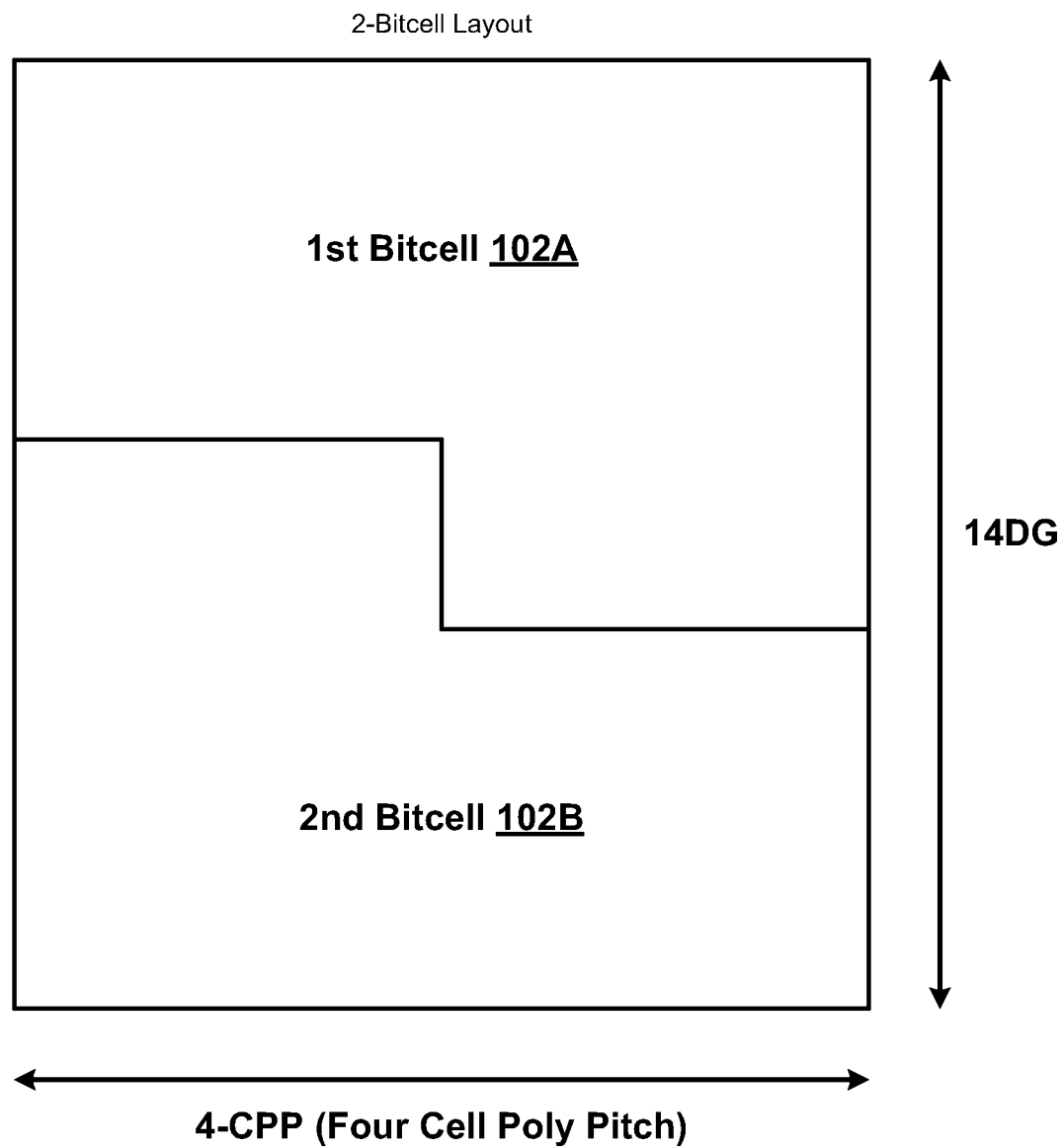
FIG. 1 illustrates a block diagram of a memory structure with multi-cell poly pitch in accordance with various implementations described herein.

Implementations described herein are directed to layout schemes and techniques for providing a multi-port (e.g., two port) memory structure with multi-cell poly pitch. In some implementations, the schemes and techniques described herein provide for an innovative 8T bitcell with a 4-cell-poly-pitch (4-CPP) layout that is designed for low wordline resistance and capacitance and low source voltage (Vcc) resistance while coping with the sub-nanometer process manufacturing limitations. The 4-CPP layout refers to transistor gate pitch. As such, various implementations described herein refer to a 4-CPP layout structure instead of the conventional 2-CPP structure, and the 4-CPP layout structure has two L-shaped structures joined to each other as shown in FIG. 1. The 4-CPP layout structure provides for widening the wordline (WL) width to mitigate the impact of larger metal resistance.

In reference to the positive impact on area, the 4-CPP bitcell layout structure may result in an improved aspect-ratio that is favorable at the SoC. At the SOC level, additional area may not be needed around the memory-macro, which may advantageously result in improved area at the SoC level. Additionally, in reference to the positive impact on performance/timing, the 4-CPP bitcell layout structure may result in a shorter wordline (WL). This may advantageously cause lower resistance and lower capacitance on the wordline-net, which may improve performance/access-time of the memory-macro.

Various implementations of layout schemes and techniques directed to providing a memory structure with multi-cell poly pitch (e.g., 4-CPP) will now be described herein with reference to FIGS. 1-4.

FIG. 1 illustrates a block diagram of a memory structure 100 with multi-cell poly pitch in accordance with various implementations described herein.

As shown in FIG. 1, the memory structure 100 may include a two-bitcell layout with a multi-cell poly pitch, such as, e.g., a four cell poly pitch (4-CPP). The two-bitcell layout may include a first bitcell 102A and a second bitcell 102B that may have structural contours that are joined together in a coupling arrangement. The first bitcell 102A and the second bitcell 102B may have multiple transistors arranged to store data during write operations and allow access of data during read operations. In some implementations, the first bitcell 102A and the second bitcell 102B may have non-linear structural contours that are joined together in a reciprocal arrangement. As shown in FIG. 1, the non-linear structural contours may refer to L-shaped structural contours that are joined together in the reciprocal arrangement. Although an L-shaped structural contours are shown here, it should be understood that some implementations may have other shapes.

In some implementations, the four cell poly pitch (4-CPP) may be arranged along the horizontal grid (x-axis), and a 14 digital grid (DG) may be arranged along the vertical grid (y-axis). The four cell poly pitch (4-CPP) may refer to a poly grid for a transistor layout, and the 14 DG may refer to a Fin grid for the transistor layout. As such, the horizontal structure refers to the poly pitch grid, and the vertical structure refers to the Fin grid.

The memory structure 100 may be implemented as an integrated circuit (IC) in various types of memory, such as, e.g., random access memory (RAM), including static RAM (SRAM), and/or any other types of volatile memory. In some implementations, the memory structure 100 may be implemented as an IC with dual rail memory architecture and related circuitry. The memory structure 100 may be integrated with computing circuitry and related components on a single chip. The memory structure 100 may be implemented in embedded systems for various electronic and mobile applications, including low power sensor nodes for IoT (Internet of things) applications.

The various implementations described herein provide a 4-CPP layout structure instead of a traditional 2-CPP structure. For instance, in FIG. 1, the 4-CPP layout structure is shown as two L-shaped structures joined to each other, and the 4 CPP layout structure provides for widening the WL width to mitigate the impact of larger metal resistance. In some instances, foundries may adopt this approach in their two-port (TP) bitcells as well as in other future nodes. In reference to impact on area, the 4-CPP, bitcell layout structure may result in an improved aspect-ratio that is favorable at the SoC. In reference to impact on performance/timing, the 4-CPP bitcell-layout may result in a shorter WL, and this may cause a lower resistance and a lower capacitance on the WL-net so as to improve performance/access-time of a memory-macro. The bitline-net's capacitance and resistance may degrade slightly compared to the 2-CPP bitcell-layout, but for sizes in which the 2-port (TP) memories are used, the number of bitcells are less on the column-side (words). Hence, degradation on performance because of this is far less when compared to the improvement seen in the wordline's capacitance and resistance.

Also, a comparison between 4CPP×7DG and 2CPP×13DG is shown below:

4CPP×7DG has a better aspect ratio and better area,
4CPP×7DG has >60% lower WWL R along with >30% lower RWL R,
4CPP×7DG has 5-8% lower WWL and RWL capacitance,
4CPP×7DG has ~25% higher BL capacitance, and
4CPP×7DG has ~14% higher total BL+ sense amplifier (SA) capacitances.

Figure 2:
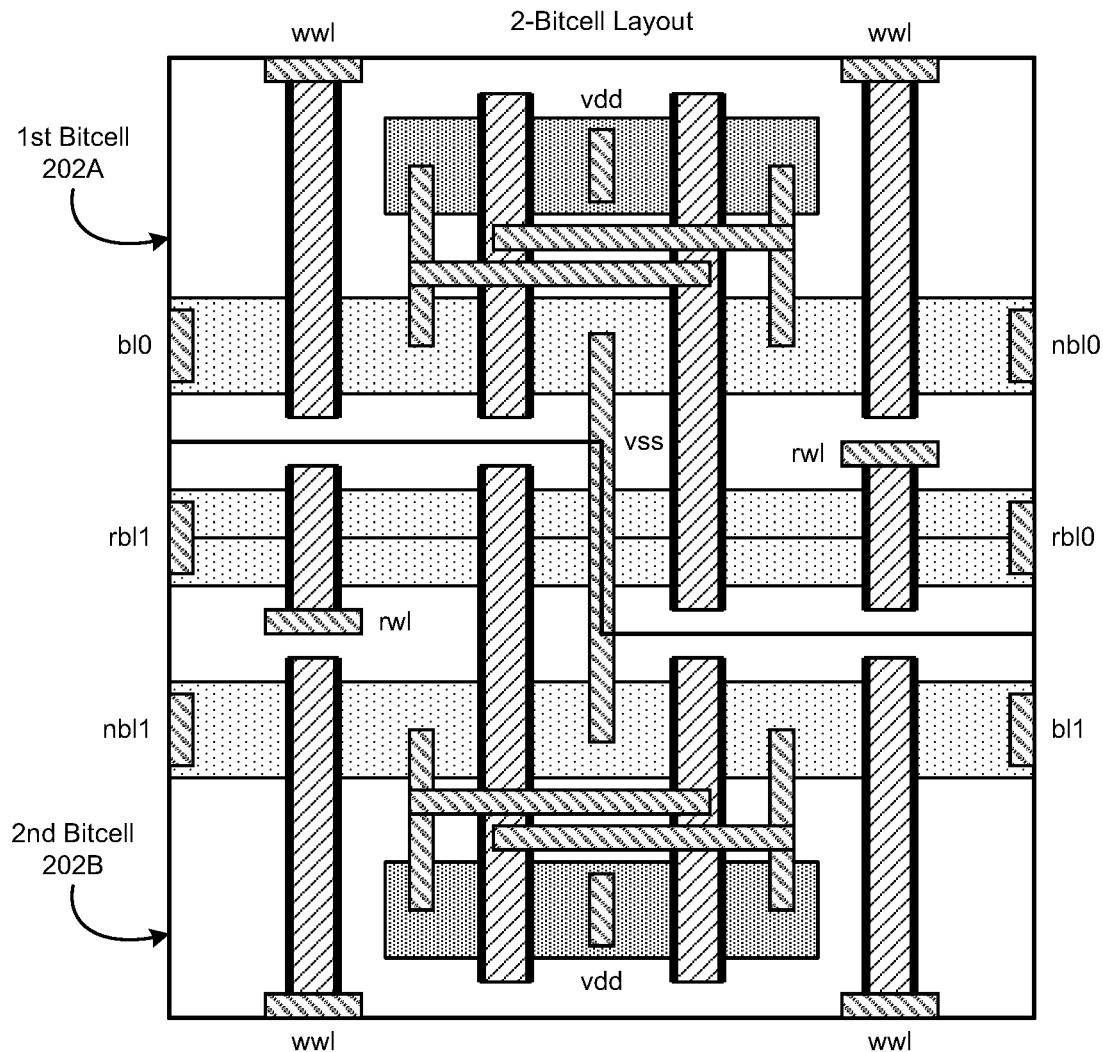
FIG. 2 illustrates a stick diagram of a memory structure with multi-cell poly pitch in accordance with various implementations described herein.

FIG. 2 illustrates a stick diagram of a memory structure 200 with multi-cell poly pitch in accordance with various implementations described herein. The stick diagram refers to a means for capturing topography and layout information using a simple diagram, and the stick diagram conveys layer information through color codes (e.g., monochrome encoding) that serves as an interface between symbolic circuit and an actual layout.

As shown in FIG. 2, the memory structure 200 may have a two-bitcell layout in a coupling arrangement. For instances, the two-bitcell layout may include a first bitcell 202A and a second bitcell 202B having non-linear structural contours that are joined together in the coupling arrangement. In some instances, the non-linear structural contours may refer to L-shaped structural contours that are joined together in a reciprocal arrangement, e.g., as shown in the similar reciprocal arrangement of FIG. 1.

As described herein, the first bitcell 202A and the second bitcell 202B may have multiple transistors arranged to store data during write operations and allow access of data during read operations. Also, as described herein, the two-bitcell layout has a four cell poly pitch (i.e., 4-CPP). In addition, the first bitcell 202A and the second bitcell 202B may include eight transistor (8T) bitcells. The transistors may include p-type metal-oxide-semiconductor (PMOS) transistors and n-type MOS (NMOS) transistors that are coupled between a source voltage (vdd) and ground (vss).

The memory structure 200 has a multi-port memory structure. For instance, as shown in FIG. 2, the multi-port memory structure refers to a two-port (TP) memory structure with a dedicated write port and a dedicated read port. The dedicated write port is accessible via the write wordline (wwl), and the dedicated read port is accessible via the read wordline (rwl). Also, the PMOS transistors and NMOS transistors are accessible via write bitlines (bl0, nbl0, bl1, nl1) and read bitlines (rbl0, rbl1). In addition, as shown in FIG. 2, various metal paths (M_Path_1, M_Path_2) are used to couple the ports, the wordlines, and the bitlines to the PMOS transistors and the NMOS transistors.

In general, there are different types of memory structures: one-wordline devices (i.e., single port) and multi-wordline devices (i.e., multi-port memory, such as, e.g., two-port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 8T SRAM bitcells with minimum-size transistors. Thus, in some implementations, careful optimization of design memory assist circuits may be used to deliver low power memory operation. Further, each bitcell in a memory array may be accessed with the write wordline (wwl), the read wordline (rwl), and complementary bitlines (bl0, nbl0, bl1, nbl1).

Figure 3:
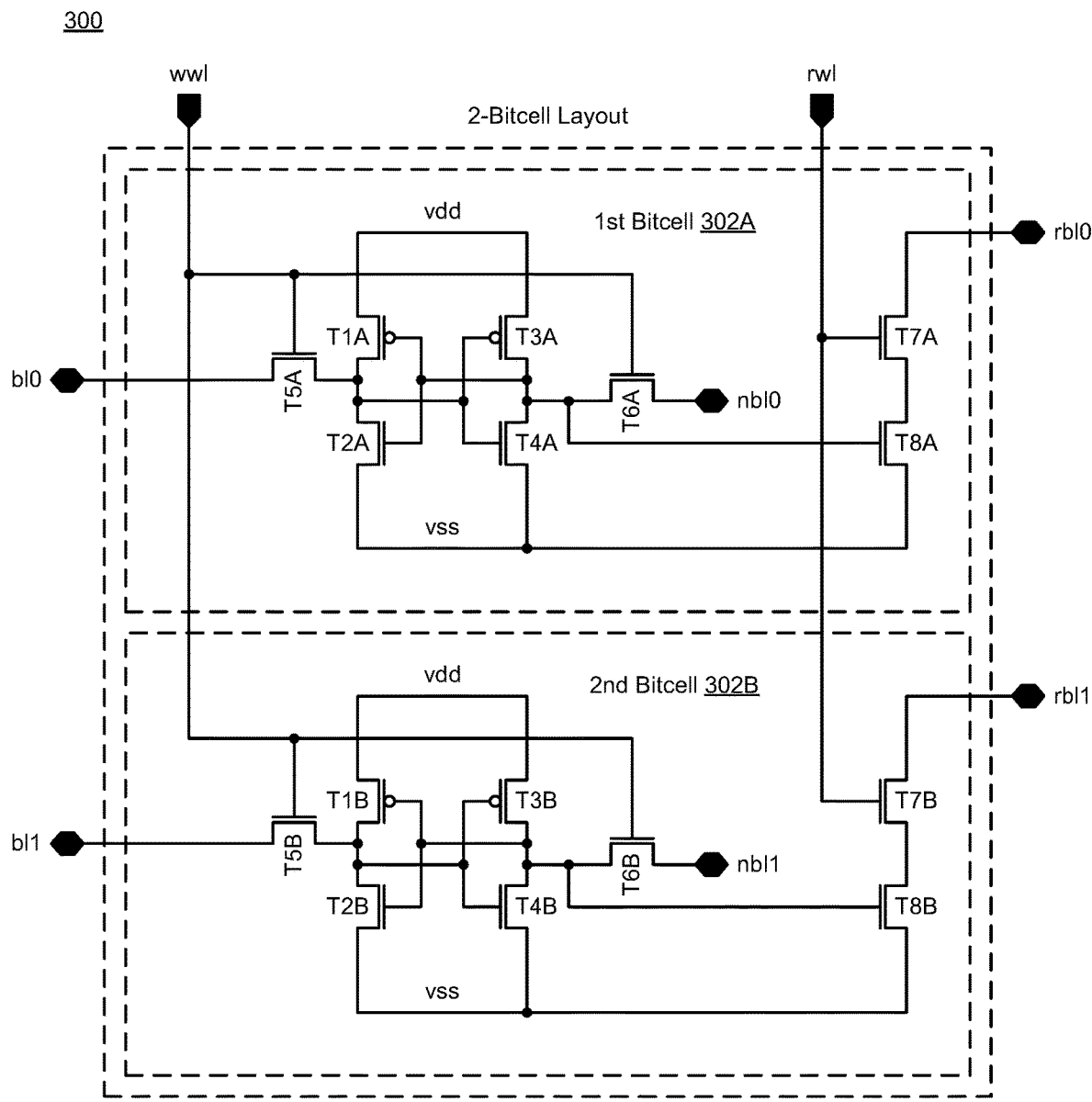
FIG. 3 illustrates a circuit diagram of a memory structure with multi-cell poly pitch in accordance with various implementations described herein.

FIG. 3 illustrates a circuit diagram of a memory structure 300 with multi-cell poly pitch in accordance with various implementations described herein.

As shown in FIG. 3, the memory structure 300 has a two-bitcell layout with a first bitcell 302A and a second bitcell 302B having non-linear structural contours (e.g., L-shaped) that are joined together in a reciprocal arrangement. As described herein, the two-bitcell layout has a four cell poly pitch (e.g., 4-CPP). The two-bitcell layout with the four cell poly pitch reduces vertical wordline resistance and capacitance of the write wordline (wwl) and the read wordline (rwl). Also, the two-bitcell layout with the four cell poly pitch may reduce resistance and capacitance by using shorter vertical wordline length and by stacking bitcells in a smaller area vertically.

The memory structure 300 is a multi-port memory structure, such as, e.g., a two-port memory structure with a dedicated write port and a dedicated read port. For instance, the memory structure 300 may include a write wordline (wwl) coupled to the first bitcell 302A and the second bitcell 302B. The memory structure 300 may include a read wordline (rwl) coupled to the first bitcell 302A and the second bitcell 302B. The first bitcell 302A and the second bitcell 302B share the write wordline (wwl) and the read wordline (rwl). The memory structure 300 may include a first pair of write bitlines (bl0, nbl0) coupled to the first bitcell 302A and a second pair of write bitlines (bl1, nbl1) coupled to the second bitcell 302B. The memory structure 300 may include a first read bitline (rbl0) coupled to the first bitcell 302A and a second read bitline (rbl1) coupled to the second bitcell 302B.

The first bitcell 302A and the second bitcell 302B may have multiple transistors that are arranged to store data during write operations and allow access of data during read operations. In some implementations, the first bitcell 302A and the second bitcell 302B may be implemented with eight transistor (8T) bitcells. As shown, the first bitcell 302A and the second bitcell 302B share the write wordline (wwl) and the read wordline (rwl).

The first bitcell 302A includes transistors (T1A, T2A, T3A, T4A, T5A, T6A) that are arranged to store data during write operations, and the first bitcell 302A includes transistors (T7A, T8A) arranged to read data during read operations. The transistors (T1A, T2A, T3A, T4A) are cross-coupled and disposed between a source voltage (vdd) and ground (vss). The transistor (T5A) is coupled between the write bitline (bl0) and transistors (T1A, T2A), and the transistor (T6A) is coupled between the write bitline (nbl0) and transistors (T3A, T4A). The write bitline (nbl0) is a complement to the write bitline (bl0). Also, the write wordline (wwl) is coupled to gates of transistors (T5A, T6A). The transistors (T7A, T8A) are coupled in series between the first read bitline (rbl0) and ground (vss). The read wordline (rwl) is coupled to a gate of the transistor (T7A), and a gate of the transistor (T8A) is coupled between transistors (T3A/T4A and T6A).

The second bitcell 302B includes transistors (T1B, T2B, T3B, T4B, T5B, T6B) that are arranged to store data during write operations, and the second bitcell 302B includes transistors (T7B, T8B) arranged to read data during read operations. The transistors (T1B, T2B, T3B, T4B) are cross-coupled and disposed between a source voltage (vdd) and ground (vss). The transistor (T5B) is coupled between the write bitline (bl1) and transistors (T1B, T2B), and the transistor (T6B) is coupled between the write bitline (nbl1) and transistors (T3B, T4B). The write bitline (nbl1) is a complement to the write bitline (bl1). The write wordline (wwl) is coupled to gates of transistors (T5B, T6B). The transistors (T7B, T8B) are coupled in series between the second read bitline (rbl1) and ground (vss). The read wordline (rwl) is coupled to a gate of the transistor (T7B), and a gate of the transistor (T8B) is coupled between transistors (T3B/T4B and T6B).

In some implementations, the first bitcell 302A and the second bitcell 302B refer to static random access memory (RAM) bitcells, which may have access ports controlled by wordlines (WLs). In some instances, the static RAM bitcells may be implemented with 8T bitcells, and multiple wordlines result in multiple access ports into the bitcells. The multiple access port devices may be varied within each bitcell so that some access devices (by port) are NFETs and some access devices by port are PFETs.

Figure 4:
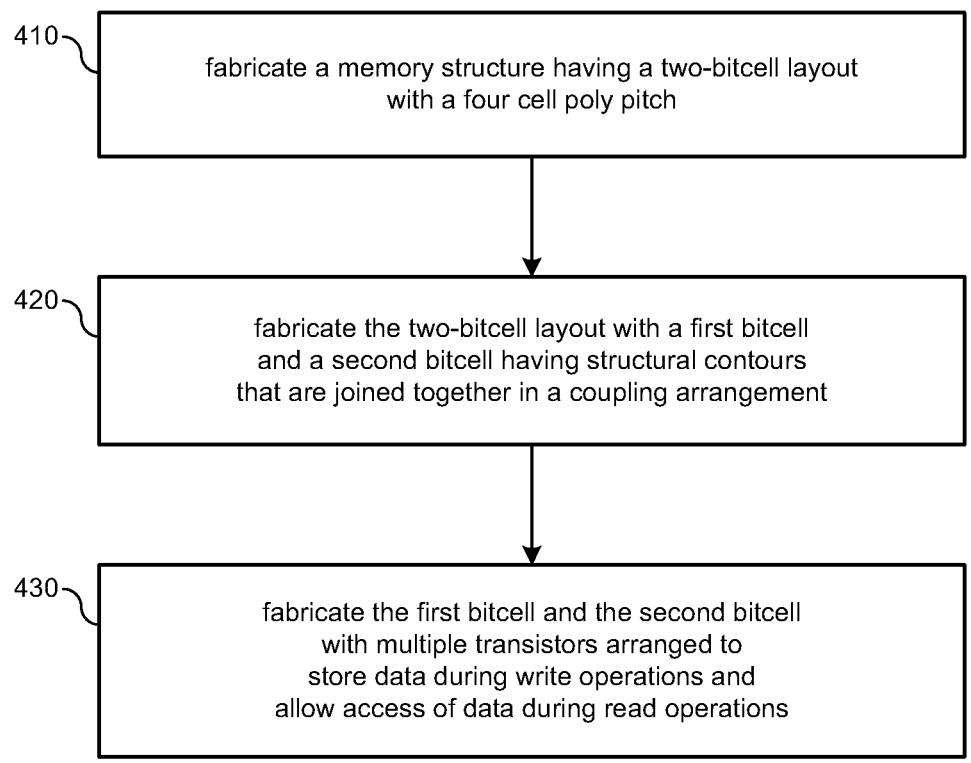
FIG. 4 illustrates a process flow diagram of a method for providing a memory structure with multi-cell poly pitch in accordance with implementations described herein.

FIG. 4 illustrates a process flow diagram of a method 400 for providing a memory structure with multi-cell poly pitch in accordance with implementations described herein.

It should be understood that even though method 400 indicates a particular order of operation execution, in some cases, various portions of operations may be executed in a different order, and on different systems. In other cases, additional operations and/or steps may be added to and/or omitted from method 400. Also, method 400 may be implemented in hardware and/or software. If implemented in hardware, method 400 may be implemented with various components and/or circuitry, as described herein in reference to FIGS. 1-3. If implemented in software, the method 400 may be implemented as a program or software instruction process configured for providing a memory structure with multi-cell poly pitch (e.g., 4-CPP), as described herein above. Also, if implemented in software, instructions related to implementing the method 400 may be stored in memory and/or a database. For instance, a computer or various other types of computing devices having a processor and memory may be configured to perform method 400.

As described in reference to FIG. 4, the method 400 may be used for fabricating and/or manufacturing, or causing to be fabricated and/or manufactured, an integrated circuit (IC) that implements layout schemes and techniques as described herein for providing a memory structure with multi-cell poly pitch (e.g., 4-CPP) using various associated devices, components and circuitry.

At block 410, method 400 may fabricate a memory structure having a two-bitcell layout with a four cell poly pitch. The two-bitcell layout with the four cell poly pitch may reduce vertical wordline resistance and capacitance of the write wordline and the read wordline. Also, the two-bitcell layout with the four cell poly pitch may reduce resistance and capacitance by shorter vertical wordline length and by stacking bitcells in a smaller area vertically. In some implementations, the memory structure may include a multi-port memory structure, such as, e.g., a two-port (TP) memory structure. The multi-port memory structure refers to a TP memory structure with a dedicated write port and a dedicated read port.

At block 420, method 400 may fabricate the two-bitcell layout with a first bitcell and a second bitcell having structural contours that are joined together in a coupling arrangement. In some implementations, method 400 may fabricate the first bitcell and the second bitcell with non-linear structural contours that are joined together in a reciprocal arrangement. In some instances, the non-linear structural contours may be L-shaped structural contours that are joined together in the reciprocal arrangement. Also, the first bitcell and the second bitcell may be implemented with eight transistor (8T) bitcells.

At block 430, method 400 may fabricate the first bitcell and the second bitcell with multiple transistors arranged to store data during write operations and allow access of data during read operations. In some implementations, the memory structure may be fabricated with a write wordline coupled to the first bitcell and the second bitcell and also with a read wordline coupled to the first bitcell and the second bitcell. The first bitcell and the second bitcell may share the write wordline and the read wordline. In addition, the memory structure may be fabricated with a first pair of write bitlines coupled to the first bitcell and also with a second pair of write bitlines coupled to the second bitcell. Further, the memory structure may be fabricated with a first read bitline coupled to the first bitcell and also with a second read bitline coupled to the second bitcell.

Described herein are various implementations of an integrated circuit. The integrated circuit may include a memory structure having a two-bitcell layout with a four cell poly pitch. The two-bitcell layout may include a first bitcell and a second bitcell having structural contours that are joined together in a coupling arrangement. The first bitcell and the second bitcell may have multiple transistors arranged to store data during write operations and allow access of data during read operations.

Described herein are various implementations of an integrated circuit. The integrated circuit may include a memory structure having a two-bitcell layout in a coupling arrangement. The two-bitcell layout may include a first bitcell and a second bitcell having non-linear structural contours that are joined together in the coupling arrangement. The first bitcell and the second bitcell may have multiple transistors arranged to store data during write operations and allow access of data during read operations.

Described herein are various implementations of a method. The method may include fabricating a memory structure having a two-bitcell layout with a four cell poly pitch. The method may include fabricating the two-bitcell layout with a first bitcell and a second bitcell with structural contours that are joined together in a coupling arrangement. The method may include fabricating the first bitcell and the second bitcell with multiple transistors arranged to store data during write operations and allow access of data during read operations.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a memory structure having a two-bitcell layout with a four cell poly pitch,
   wherein the two-bitcell layout includes a first bitcell and a second bitcell having structural contours that are joined together in a coupling arrangement, and
   wherein the first bitcell and the second bitcell have multiple transistors arranged to store data during write operations and allow access of data during read operations.

2. The integrated circuit of claim 1, wherein the first bitcell and the second bitcell have non-linear structural contours that are joined together in a reciprocal arrangement.

3. The integrated circuit of claim 2, wherein the non-linear structural contours refer to L-shaped structural contours that are joined together in the reciprocal arrangement.

4. The integrated circuit of claim 1, wherein the memory structure comprises a multi-port memory structure.

5. The integrated circuit of claim 4, wherein the multi-port memory structure refers to a two-port memory structure with a dedicated write port and a dedicated read port.

6. The integrated circuit of claim 1, wherein the first bitcell and the second bitcell are eight transistor (8T) bitcells.

7. The integrated circuit of claim 1, further comprising:
   a write wordline coupled to the first bitcell and the second bitcell; and
   a read wordline coupled to the first bitcell and the second bitcell,
   wherein the first bitcell and the second bitcell share the write wordline and the read wordline.

8. The integrated circuit of claim 7, wherein the two-bitcell layout with the four cell poly pitch reduces vertical wordline resistance and capacitance of the write wordline and the read wordline.

9. The integrated circuit of claim 1, further comprising:
   a first pair of write bitlines coupled to the first bitcell; and
   a second pair of write bitlines coupled to the second bitcell.

10. The integrated circuit of claim 1, further comprising:
    a first read bitline coupled to the first bitcell; and
    a second read bitline coupled to the second bitcell.

11. An integrated circuit, comprising:
    a memory structure having a two-bitcell layout in a coupling arrangement,
    wherein the two-bitcell layout includes a first bitcell and a second bitcell having non-linear structural contours that are joined together in the coupling arrangement, and
    wherein the first bitcell and the second bitcell have multiple transistors arranged to store data during write operations and allow access of data during read operations, wherein the non-linear structural contours refer to L-shaped structural contours that are joined together in a reciprocal arrangement.

12. The integrated circuit of claim 11, wherein the two-bitcell layout has a four cell poly pitch.

13. An integrated circuit, comprising:
    a memory structure having a two-bitcell layout in a coupling arrangement,
    wherein the two-bitcell layout includes a first bitcell and a second bitcell having structural contours that are joined together in the coupling arrangement, and wherein the first bitcell and the second bitcell have multiple transistors arranged to store data during write operations and allow access of data during read operations, wherein the memory structure comprises a multi-port memory structure.

14. The integrated circuit of claim 13, wherein the multi-port memory structure refers to a two-port memory structure with a dedicated write port and a dedicated read port.

15. An integrated circuit, comprising:
a memory structure having a two-bitcell layout in a coupling arrangement,
wherein the two-bitcell layout includes a first bitcell and a second bitcell having structural contours that are joined together in the coupling arrangement, and wherein the first bitcell and the second bitcell have multiple transistors arranged to store data during write operations and allow access of data during read operations, wherein the first bitcell and the second bitcell are eight transistor (8T) bitcells.

16. A method, comprising:
fabricating a memory structure having a two-bitcell layout with a four cell poly pitch;
fabricating the two-bitcell layout with a first bitcell and a second bitcell having structural contours that are joined together in a coupling arrangement; and
fabricating the first bitcell and the second bitcell with multiple transistors arranged to store data during write operations and allow access of data during read operations.

17. The method of claim 16, further comprising:
fabricating the first bitcell and the second bitcell with non-linear structural contours that are joined together in a reciprocal arrangement.

18. The method of claim 17, wherein the non-linear structural contours are L-shaped structural contours that are joined together in the reciprocal arrangement.

19. The method of claim 16, wherein the first bitcell and the second bitcell are eight transistor (8T) bitcells.

* * * * *